US005585925A

United States Patent [19]

Sato et al.

[11] Patent Number: 5,585,925

[45] Date of Patent: Dec. 17, 1996

[54] ALIGNMENT METHOD

[75] Inventors: Makoto Sato; Shigeyuki Uzawa, both of Tokyo, Japan

[73] Assignee: Canon Kabushiki Kaisha, Tokyo, Japan

[21] Appl. No.: 457,591

[22] Filed: Jun. 1, 1995

[30] Foreign Application Priority Data

Jun. 6, 1994 [JP] Japan .................................... 6-123649

[51] Int. Cl.[6] ...................................................... G01B 11/00

[52] U.S. Cl. ............................ 356/401; 250/548; 355/53

[58] Field of Search .................................... 356/399–401; 355/53, 43; 250/548, 559.3

[56] References Cited

U.S. PATENT DOCUMENTS 4,659,227 4/1987 Sato et al. .
4,870,288 9/1989 Abuku et al. .
5,142,156 8/1992 Ozawa et al. .
5,153,678 10/1992 Ota .
5,270,771 12/1993 Sato .
5,317,615 5/1994 Ebinuma et al. .
5,455,679 10/1995 Houryu et al. .......................... 356/401

*Primary Examiner*—K. Hantis
*Attorney, Agent, or Firm*—Fitzpatrick, Cella, Harper & Scinto

[57] ABSTRACT

An alignment method for successively aligning a plurality of alignment areas of a plurality of successively supplied substrates with predetermined reference positions, includes four processes. The first process measures the positions of the alignment areas of at least a leading one of the substrates with respect to preassigned positions of the alignment areas comprising a preassigned arrangement of the alignment areas to obtain the actual arrangement of the alignment areas. The second process determines conversion parameters, such that when the relationship between the actual arrangement of alignment areas and the preassigned arrangement of alignment areas obtained in the first process is represented by a conversion formula including the conversion parameters and a correction remainder representing the error in the actual arrangement as compared to the preassigned arrangement, the error becomes a minimum. The third process stores error data representing the amount of the error in the measured position of each of the alignment areas measured in the first process with respect to the preassigned positions of the alignment areas using the determined conversion parameters. The fourth process corrects the error data stored in the third process during the alignment of successive substrates by the conversion parameters obtained for the substrates.

4 Claims, 9 Drawing Sheets

S
ALIGNMENT ILLUMINATING DEVICE
2
3
4
IMAGE PICK-UP
5
A/D CONVERTER
6
INTEGRATOR
7
POSITION DETECTOR
8
CPU
9
STAGE DRIVER
10
STORAGE DEVICE
12
R
1
W
11

| FIG. 3A | FIG. 3B |
|---|---|

| FIG. 4A | FIG. 4B |
|---|---|

ALIGNMENT METHOD

BACKGROUND OF THE INVENTION

1. Field of the Invention

The present invention relates to an alignment method for precisely aligning a plurality of areas on substrates to be aligned with predetermined reference positions in a device requiring precise alignment, such as a contraction projection type exposure apparatus in which an electronic circuit pattern is projected onto a semiconductor substrate for exposure.

2. Description of Related Art

The development of highly integrated semiconductors, in recent years, has caused the dimensions of the semiconductor device pattern to be of the order of a submicron, so that technical developments have been carried out extensively for more precise alignment of the mask and the wafer in a semiconductor exposure apparatus.

As a semiconductor exposure device, a so-called stepper of the contraction projection type is widely used. FIG. 5a schematically illustrates an example of a contraction projection type semiconductor exposure device.

Referring to the figure, a light beam from an exposure illuminating system (not illustrated) illuminates an electronic circuit pattern formed on a reticle R. The illuminated pattern is projected onto a wafer W for exposure through a projection optical system 1. Wafer W is placed on a stage 11 movable two-dimensionally along the X and Y planes. S denotes an alignment optical system, which detects a position along the x dimension in the figure. A similar alignment optical system (not illustrated) is also provided, which detects a position along the y dimension. A CPU 9 (central processing unit) controls the operation of the entire exposure apparatus.

The alignment of the wafer W relative to the reticle R is carried out before exposure by the following process. When wafer W is placed onto XY stage 11 by a wafer transporting device (not illustrated), CPU 9 generates a command to a stage driver 10 such that, as illustrated in FIG. 6, alignment marks M1x and M1y of shot area S1 are positioned within the field of view of alignment optical system S, thereby causing XY stage 11 to be driven. An alignment illuminating device 2 irradiates wafer W with a light beam which does not cause exposure nor photosensitization of a resist (photosensitization agent) coated on the wafer W, and the light beam illuminates an alignment mark M1x (hereinafter referred to as wafer mark) through a beam splitter 3, reticle R and projection optical system 1.

FIG. 5b illustrates this wafer mark M1x in detail, wherein a plurality of marks having the same rectangular shape are disposed at a constant pitch of λp. A light beam reflected from wafer mark M1x reaches the beam splitter 3 by passing through, once again, projection optical system 1 and reticle R, where it is reflected, and the reflected light passes through an image-forming optical system 4 to form a wafer mark M1x image WM on an imaging surface of an image pick-up device 5. In the image pick-up device 5, the mark M1x image is subjected to photoelectric conversion, and the resultant image is converted into two-dimensional digital signal rows by an A/D (analog-to-digital) converter 6.

In FIG. 5a, reference numeral 7 denotes an integrating device, for setting, as illustrated in FIG. 5b, a processing window Wp with respect to wafer mark image WM, converted into a digital signal by A/D converter 6, and performing a movement averaging operation along the Y dimension in FIG. 5b in the aforementioned window to convert the two-dimensional image signal to a one-dimensional digital signal row S(x).

In the same figure, reference numeral 8 denotes a position detector in which pattern matching is performed using a previously stored template pattern with respect to the one-dimensional signal row S(x) output from the integrating device 7. The template pattern which matches most closely with the S(x) address position is output to the CPU 9. Since the output signal represents a mark position with reference to an image pick-up plane of the image pick-up device 5, CPU 9 computes position $a_{x1}$ which is the position of wafer mark M1x along the x dimension with respect to a portion of the reticle R from the relative position of the image pick-up device 5 and reticle R previously obtained from a method which is not illustrated. This completes the measurement for the first measurement shot area along the x dimension. Then, CPU 9 measures the position ay1 along the y dimension of the wafer mark M1y with respect to reticle R using the same process employed to measure the displacement along the x dimension.

The CPU 9 causes stage 11 to move to the position of a second measurement shot area S2 to measure the position of wafer marks $M_{2x}$ and $M_{2y}$ in the x and y dimensions as it has been done for the first measurement shot area S1. The same measurements are performed for the remaining predetermined number of measurement shot areas, n, (n=4 in the example of FIG. 6), and the measured positions for each of the shot areas are stored as $a_{xi}$, $a_{yi}$ (where i=1, 2 . . . , n).

Then, based on the obtained position of each measurement shot area, the CPU 9 aligns the wafer W relative to the reticle R in the following way. First, a preassigned mark position $d_i$ of the ith measurement shot area is found by the formula $$d_i=[d_{xi}, d_{yi}]^T,$$

where $d_{xi}$ represents the preassigned position of the ith shot area along the x dimension, $d_{yi}$ represents the preassigned position of the ith shot area along the y dimension, and T indicates that the matrix $[d_{xi}, d_{yi}]$ is transposed. The preassigned position $d_i$ is superimposed by correction and conversion onto the actual mark position $a_i$ of the ith measurement short area found by the formula $$a_i=[a_{xi}, a_{yi}]^T$$

which is obtained by wafer mark measurements. As a result, the relationship between a correction position $g_i$ of the ith short area, including a correction remainder $e_i$ of the ith shot area ($e_i=[e_{xi}, e_{yi}]^T$), obtained by the formula $$g_i=[g_{xi}, g_{yi}]^T=[a_{xi}+e_{xi}, a_{yi}+e_{yi}]^T,$$

and $d_i$ is expressed by formula (1), $$g_i=Ad_i+S \tag{1}$$

so as to allow computation of the conversion parameters A, S such that the sum of the squares of the correction remainder $e_i$ is a minimum, where $e_i$ is the correction of ith shot area in the x and y dimensions, $e_i$ is the correction remainder of the ith shot area along the x dimension, $e_{yi}$ is the correction remainder of the ith shot area along the y dimension, T indicates that the matrices $[a_{xi}, a_{yi}]$ and $[e_{xi}, e_{yi}]$ are transposed, $g_{xi}$ is the correction position of the ith shot area along the x dimension, $g_{yi}$ is the correction position of the ith shot area along the y dimension, and T also indicates that the matrix $[a_{xi}+e_{xi}, a_{yi}+e_{yi}]$ is transposed. Based on the conversion parameters A, S, the CPU 9 computes the correction position $g_i$ in accordance with formula (1) to allow the XY stage 11 to be driven in accordance with the correction position $g_i$. This allows step-and-repeat operations to be performed which minimizes the difference between the measured mark position and designed mark position, so that exposure of all shot areas formed on wafer W is performed.

Here, A and S are defined as in formula (2):

$$A = \begin{pmatrix} 1+\alpha_x & 0 \\ 0 & 1+\alpha_y \end{pmatrix} \begin{pmatrix} \cos\theta_y - \sin\theta_y \\ \sin\theta_x - \cos\theta_x \end{pmatrix} \quad (2)$$

$$S = \begin{pmatrix} S_x \\ S_y \end{pmatrix}$$

where αx and αy denote, respectively, the expansion or contraction of each wafer in the x and y dimensions; $\theta_x$ and $\theta_y$ denote respectively the rotation component of the x and y coordinate axes of the shot arrangement from the preassigned x and y coordinate axes of the shot arrangement as shown by θ and θ+ω in FIG. 8 of U.S. Pat. No. 5,153,678, which is hereby incorporated by reference thereto; s denotes the displacement of the entire wafer from the preassigned position to the measured position, where $S_x$ denotes the displacement of the entire wafer along the x dimension from the preassigned position to the measured position, and $S_y$ denotes the displacement of the entire wafer along the y dimension from the preassigned position to the measured position.

According to this method, aligning is performed using a limited number of sample shots, and not by measuring the displacement of all the exposure shots, so that throughput of the device is increased. However, although the relationship expressed by formula (1) is a linear expression representing error components of parallel (translational) movement, rotation, and expansion and contraction of the wafer W, there are some wafers to be processed in the actual semiconductor production process which are partly deformed, so that precise alignment of the entire wafer cannot be obtained by a linear expression.

SUMMARY OF THE INVENTION

In view of the above-described problem, it is an object of the present invention to provide an alignment method in which high precision alignment can be performed for a substrate for which one linear predetermined conversion formula cannot express the relationship between the measured position of the alignment areas and the preassigned position of the alignment areas.

It is still another object of the present invention to provide an alignment apparatus and method for performing alignment of a plurality of substrates, even when deviations occur in each of the substrates from a predetermined conversion formula.

According to one aspect, the present invention which achieves at least one of these objectives relates to an alignment method for successively aligning a plurality of alignment areas of a plurality of successively supplied substrates with predetermined reference positions. The plurality of alignment areas of each substrate are formed in accordance with a predetermined arrangement. The method comprises the step of performing a first process of measuring the positions of the alignment areas of at least a leading one of the substrates with respect to the preassigned positions of the alignment areas comprising a preassigned arrangement of the alignment areas to obtain the actual arrangement of the alignment areas. The method also comprises the step of performing a second process of determining conversion parameters such that when the relationship between the actual arrangement of alignment areas and the preassigned arrangement of alignment areas obtained in the first process is represented by a conversion formula including the conversion parameters and a correction remainder representing the error in the actual arrangement as compared to the preassigned arrangement, the error becomes a minimum. The method also comprises a third process of storing error data representing the amount of the error in the measured position of each of the alignment areas measured in the first process with respect to the preassigned positions of the alignment areas using the determined conversion parameters. The method also comprises a fourth process of correcting the error data stored in the third process performing step during alignment of successive substrates by the conversion parameters obtained for the substrates.

The fourth process can comprise the steps of determining a weighted function based on an error in the actual arrangement of alignment areas obtained for successive substrates and performing weighting of the error data stored in the third process by the weighted function. In addition, the method can further comprise the step of determining the weighted function by the distance between the position of an alignment area and a grid point used when the conversion parameters are obtained for the leading one of the substrates. In addition, the method can further comprise the step of determining the weighted function by computing the ratio of the error data stored in the third process and the error data obtained for successive substrates.

The error, obtained from a predetermined conversion formula, by measuring as many alignment areas as possible in the first and second processes, can be regarded as a correction value obtained by the conversion formula during alignment of substrates of the same lot. Error correction is carried out based on the deviation from the conversion formula of each of the substrates. Therefore, high precision alignment can be insured regardless of the variations of each substrate.

In addition, according to one aspect of the invention, the displacement of each of the areas on a substrate can be calculated from a plurality of sample positions and the deviation from a predetermined conversion formula is previously obtained using as many samples as possible for one substrate. This calculated displacement can then be stored for use in correcting the alignment of subsequent substrates. The amount of deviation from the conversion formula is reflected as a weighted value during correction. Therefore, high precision alignment can be obtained even when there is a change in the deviation trend of the alignment areas of each of the substrates from the conversion formula.

Other features and advantages of the present invention will become apparent upon reviewing the drawings in conjunction with the detailed description of preferred embodiments provided below.

BRIEF DESCRIPTION OF THE DRAWINGS

FIG. 5(*b*) is a schematic view of a wafer mark image and a processing window.

DESCRIPTION OF THE PREFERRED EMBODIMENTS

Figure 1:
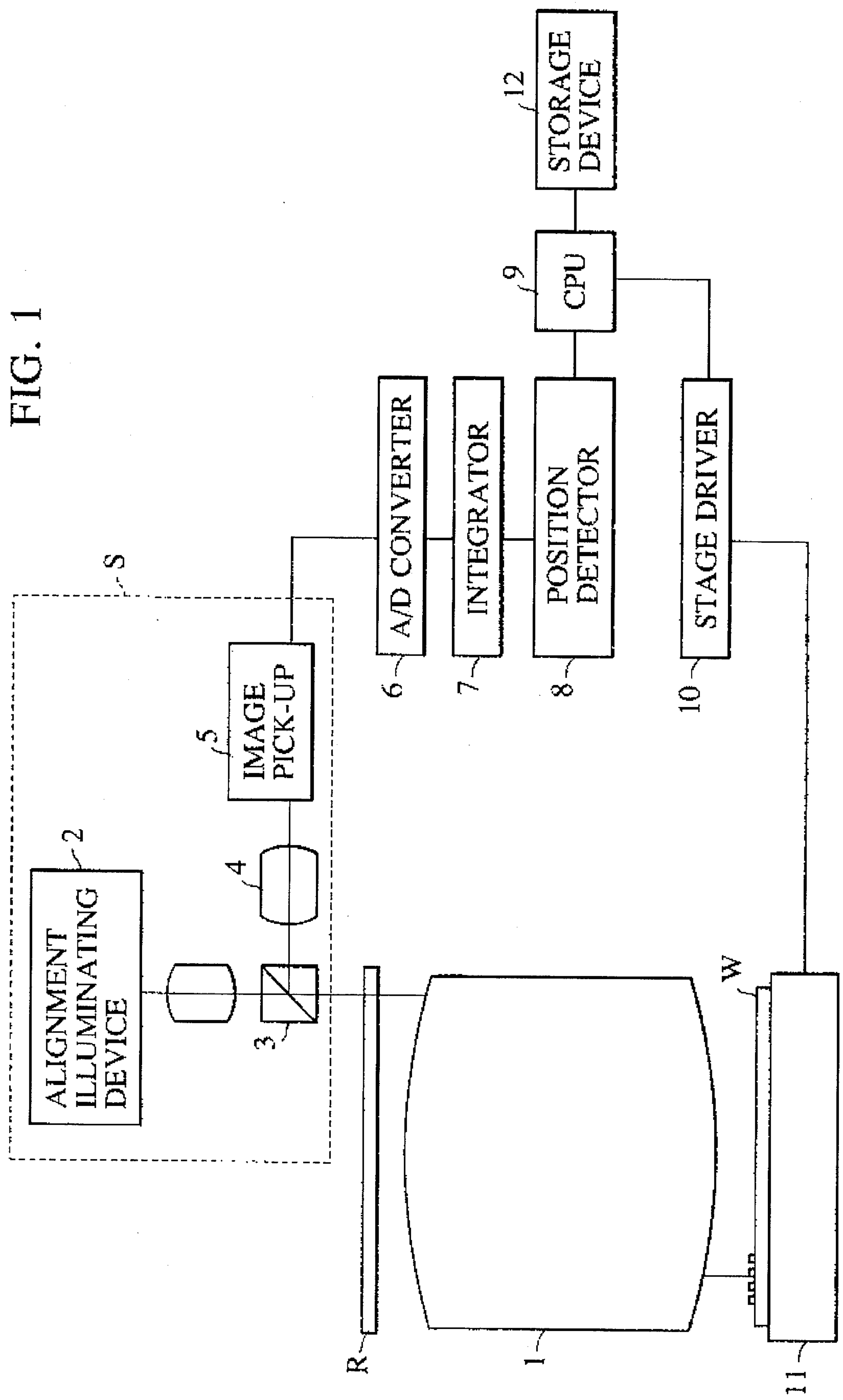
FIG. 1 is a schematic view of an exposure apparatus for producing semiconductors to which is applied the present invention.

A detailed description will hereunder be given of the present invention with reference to the embodiments illustrated in the drawings. FIG. 1 is a schematic view of an alignment device of a first embodiment of the present invention. Reference numerals and letters that are the same as those used in FIG. 5(*a*) denote the same or similar elements.

Figure 5A:
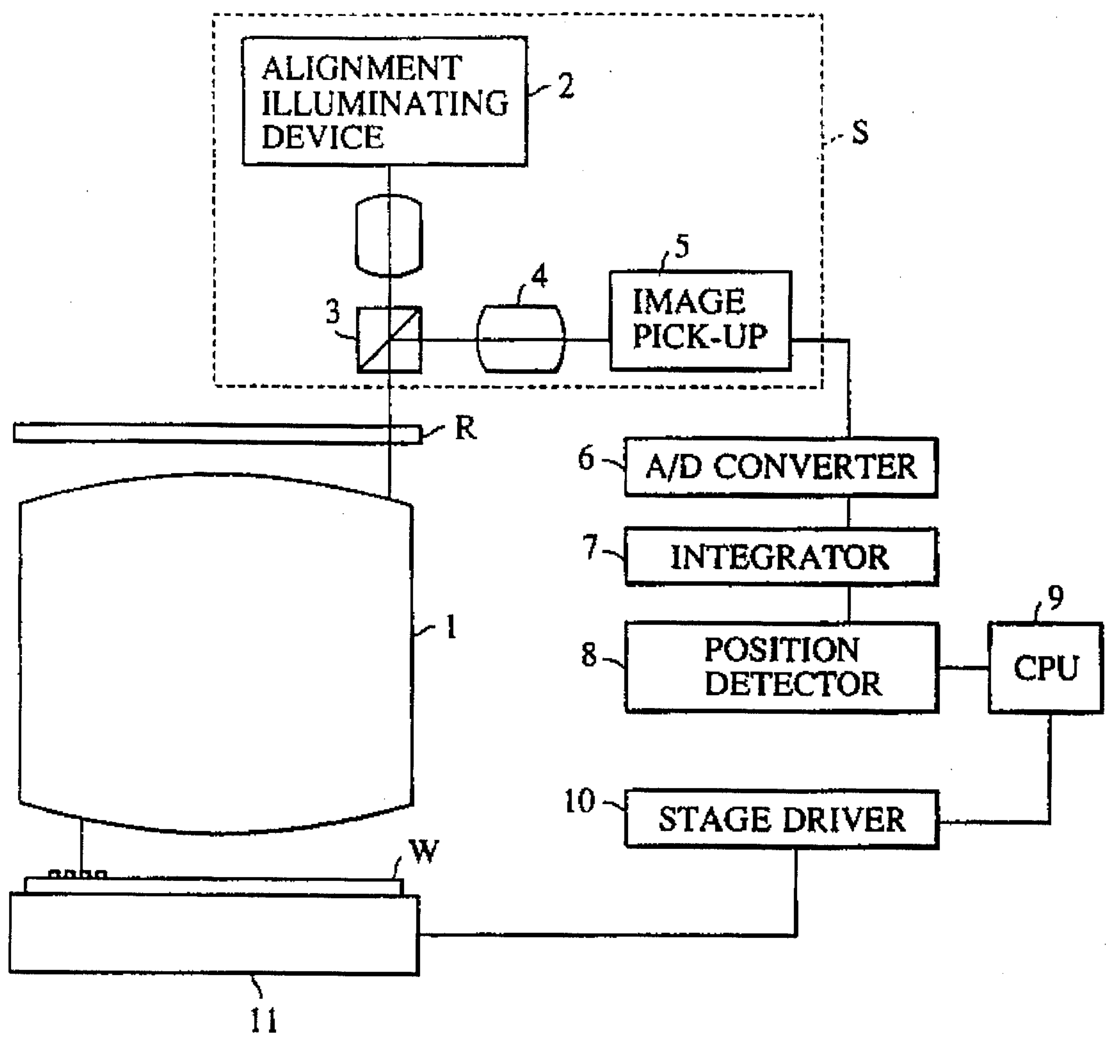
FIG. 5(*a*) is a schematic view of a conventional semiconductor exposure apparatus.

Referring to the figure, the functions of alignment optical system S, A/D (analog-to-digital) converter 6, integrating device 7, and position detector 8, are the same as those of the corresponding components in the conventional apparatus shown in FIG. 5(*a*), so that their details will be omitted here. In the embodiment, a storage device 12 is added to the arrangement of the conventional apparatus.

Figure 3A:
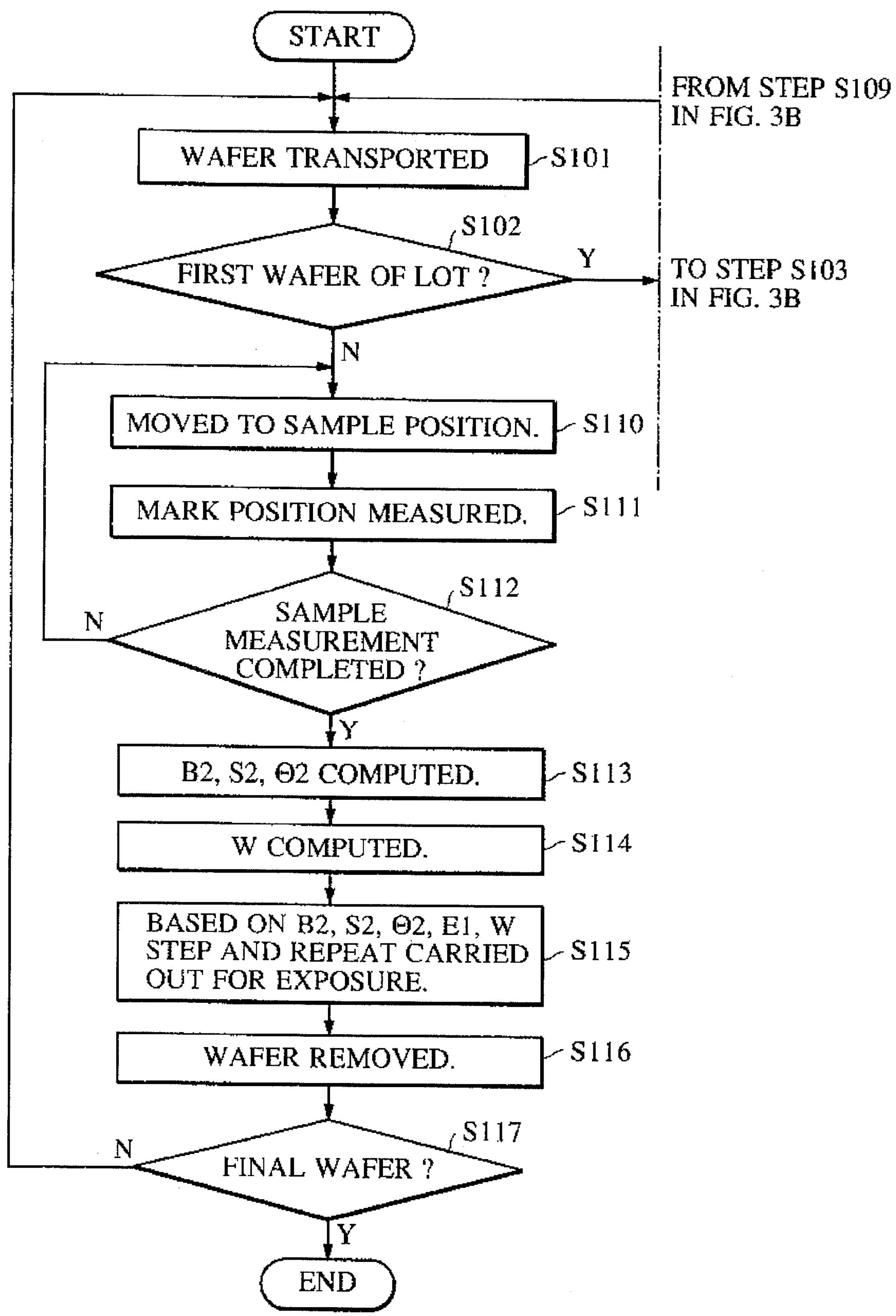
FIGS. 3A and 3B are flowcharts illustrating a first embodiment of an alignment method of the present invention.
Figures 3, 3B:
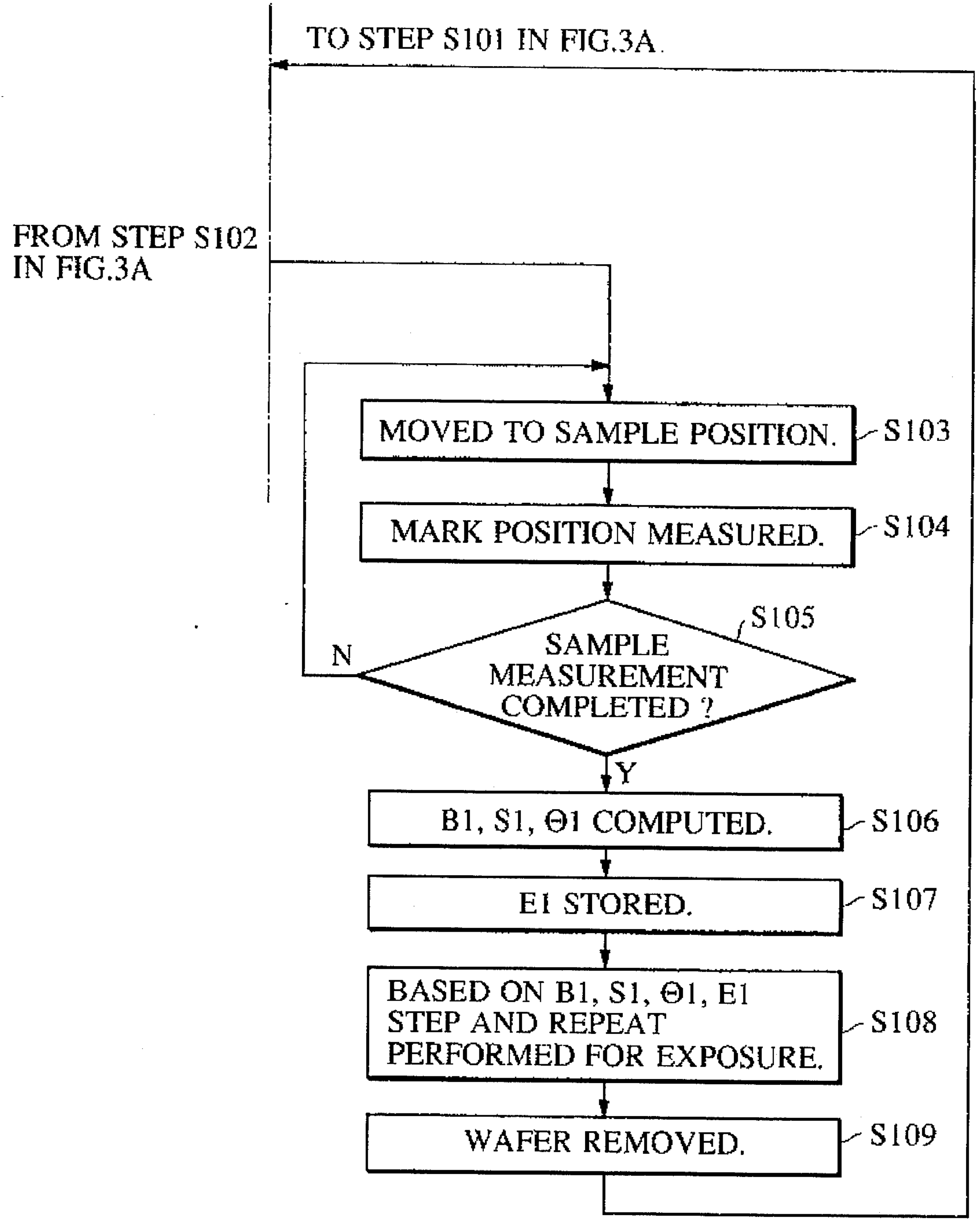
FIG. 3 is a schematic representation of the relationship between FIGS. 3A and 3B.

A description will hereunder be given of the alignment method of the embodiment based on the flowcharts illustrated in FIGS. 3A and 3B. If not particularly specified, the determination and control operations are assumed as being executed by a CPU (central processing unit) 9.

In Step S101, CPU 9 sends a command to a wafer transporting device (not illustrated) to allow placement of the first wafer W1 of the lot to be processed (e.g. there are about 25 or 50 wafers in one lot to be subjected to the same processing) onto XY stage 11.

In Step S102, a determination is made as to whether or not the wafer W1 placed on XY stage 11 is the first wafer of the lot. If it is the first wafer, the process proceeds to Step 103.

Figure 2A:
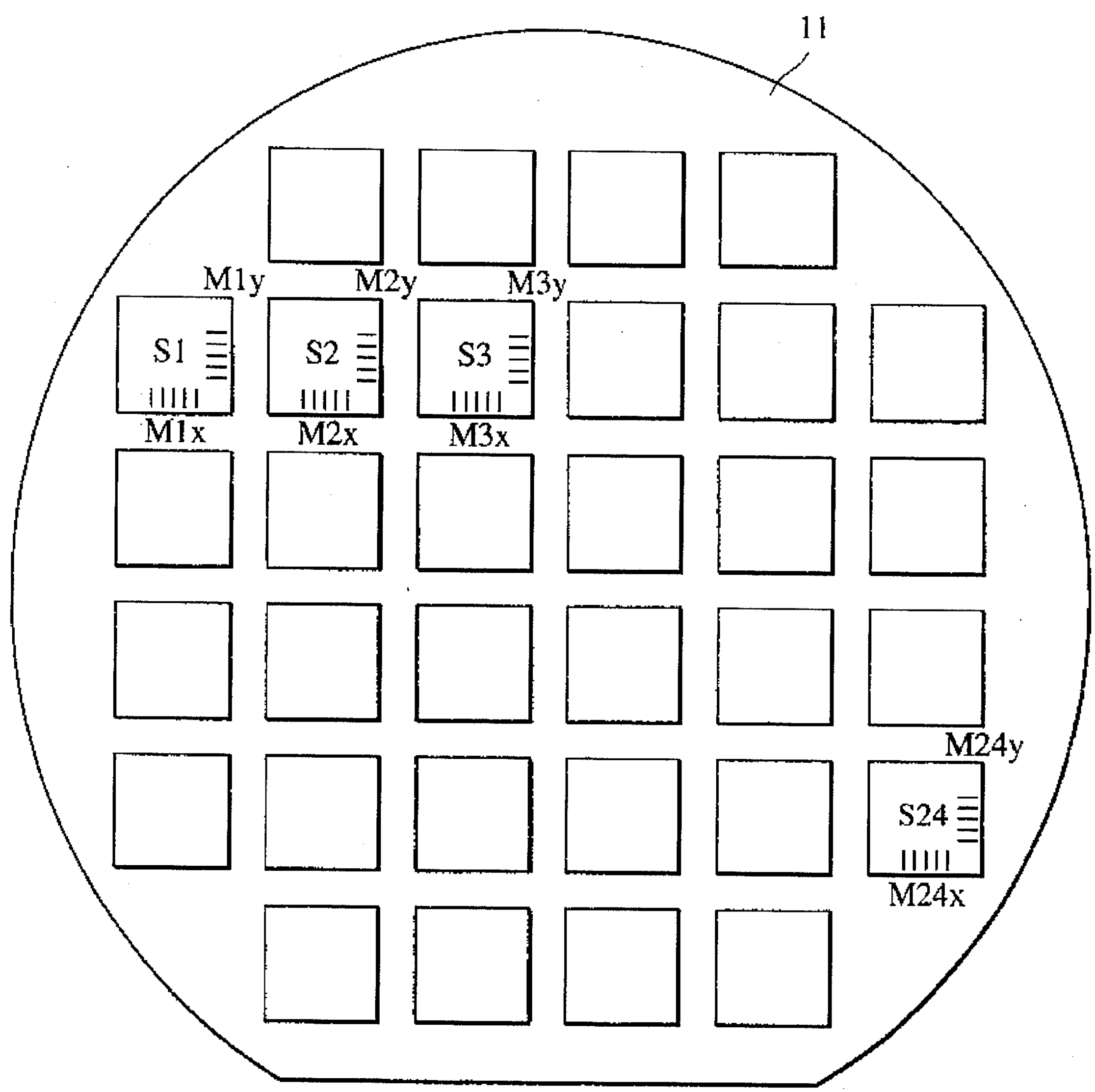
FIGS. 2(*a*) and 2(*b*) illustrate sample shot positions on a wafer.

In Step S103, CPU 9 sends out a command to stage driver 10 to drive the xy stage 11 so that alignment marks M1x and M1y formed at the first measurement shot area S1 of the wafer W1 illustrated in FIG. 2*a* are positioned within the field of view of alignment optical system S.

Figure 5B:
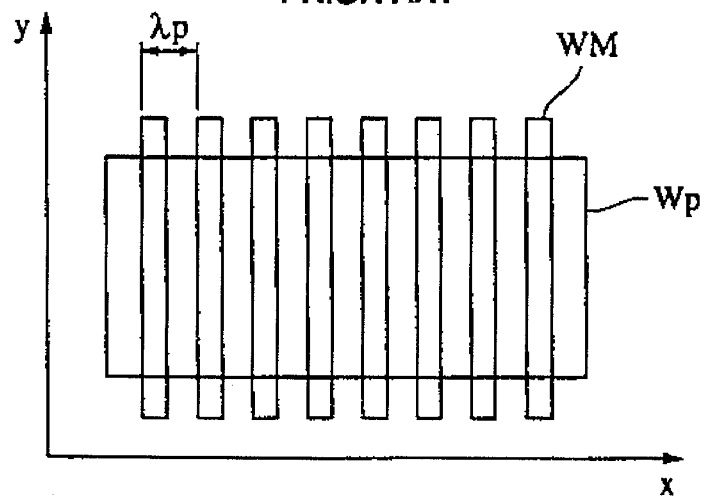
Figure 6:
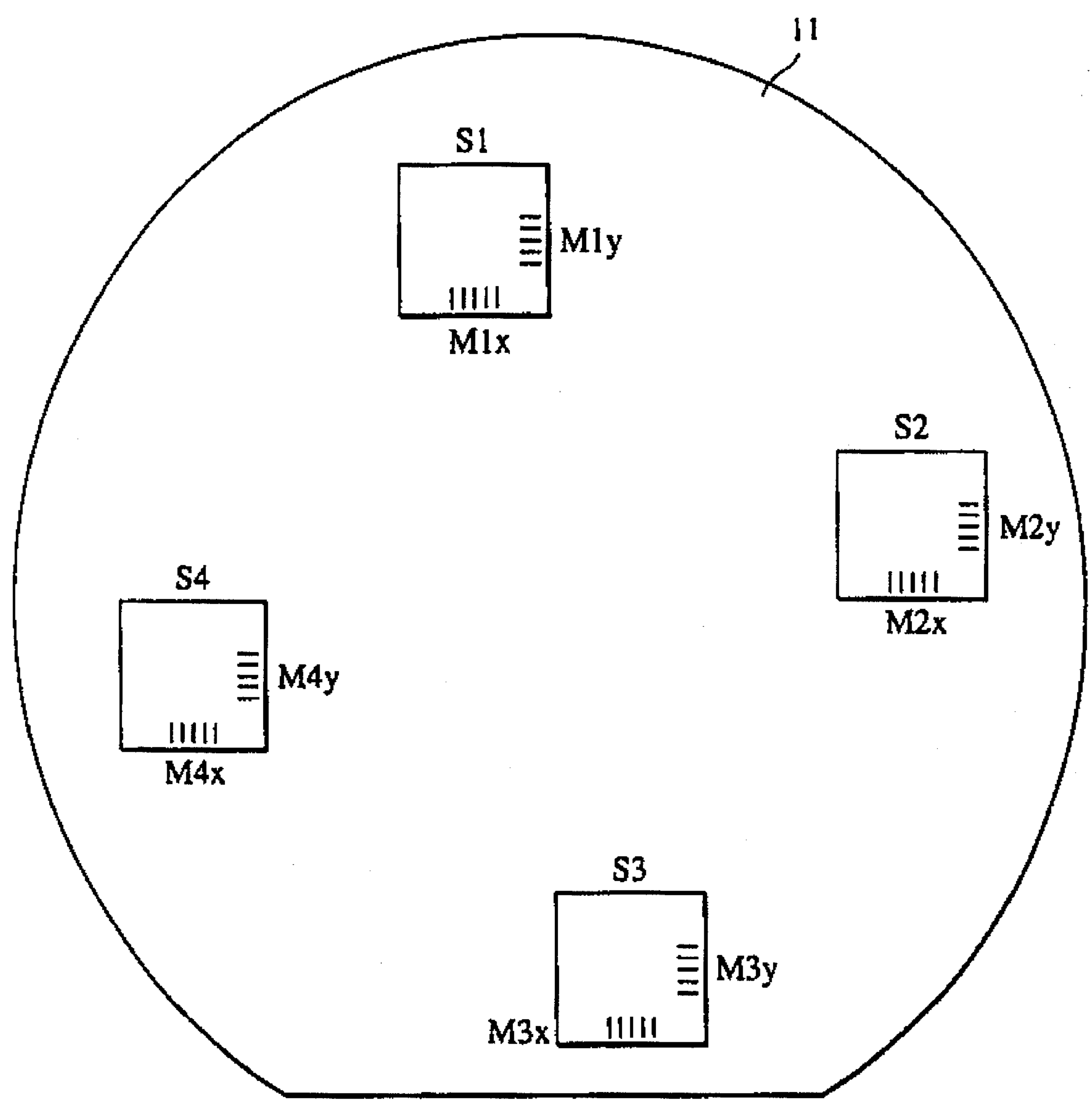
FIG. 6 illustrates sample shot positions of a conventional semiconductor exposure apparatus.

In Step S104, the light beam generated by the alignment illuminating device 2, which does not cause exposure, passes through the beam splitter 3, the reticle R, and the projection optical system 1 and illuminates alignment marks M1x and M1y. The alignment marks M1x and M1y comprise grids as shown in FIG. 5*b*. By means of A/D converter 6, integrating device 7, and position detector 8 the displacement of marks M1x and M1y relative to the reticle R is determined by the same method as described in the conventional apparatus. The position $a^1_1$ is found by:

$$a^1_1=[a^1_{x1}, a^1_{y1}]^T$$

where $a^1_1$ denotes the position, in the x and y directions, of the first shot area S1 of the wafer W1, the number in superscript to the right of "a" representing the number of the wafer, while the number in the subscript represents the number of the shot area. More generally, the reference letters used in the mathematical expressions below denote the same parameters as the corresponding letters discussed above in connection with the FIGS. 5(*a*) and 6 embodiment, except that the number in superscript represents the number of the wafer.

In Step S105, CPU 9 determines whether or not sample measurement is completed. If not, Steps S103 and S104 are repeated for each shot area until sample measurement for wafer W1 is completed. Upon completion, displacement measurement in the x and y dimensions of each of exposure shot areas, S1, S2, S3, . . . , S24 on wafer W1 is completed. The position of each of the shot areas on wafer W1 is illustrated in FIG. 2*a*. If sample measurement is complete, the process proceeds to Step S106.

In Step S106, when preassigned mark position $d_i$, at each measurement shot area (sample), found by the expression $$d_i=[d_{xi}, d_{yi}]^T,$$

is superimposed onto the actual mark position by correction and conversion of the actual mark displacement $a^1_i$, obtained by wafer mark measurement and found by the expression, $$a^1_i=[a^1_{xi}, a^1_{yi}]^T,$$

and when the relationship of correction position $g^1_i$ obtained by the formula (3) $g^1_i=[g^1_{xi}, g^1_{yi}]^T=[a^1_{xi}+e^1_{xi}, a^1_{yi}+e^1_{yi}]^T$ (3) and $d_i$ is expressed as $g^1_i=B^1\theta^1 d_i+S^1$, CPU 9 computes conversion parameters $B^1$, $\theta^1$, and $S^1$, by which the sum of the squares of correction remainder $e_i^1$ of the ith shot of wafer W1 is a minimum, based on the condition that V becomes a minimum when it is expressed by formula (4)

$$V=-\sum_{n}^{l}|e_i^1|^2 \text{ (where, } i=1, 2, \ldots, 24) \quad (4)$$

where $B^1$, $\theta^1$, and $S^1$ are defined respectively by formula (5)

$$B^1=\begin{pmatrix} 1+\beta 1_x & 0 \\ 0 & 1+\beta 1_y \end{pmatrix} \theta^1=\begin{pmatrix} \cos\theta_y^1 & -\sin\theta_y^1 \\ \sin\theta_y^1 & \cos\theta_x^1 \end{pmatrix} \quad (5)$$

$$S^1=\begin{pmatrix} S_x \\ S_y \end{pmatrix}$$

where $\beta 1_x$ and $\beta 1_y$ denote respectively the expansion or contraction of each wafer in the x and y dimensions, and $\theta^1_x$ and $\theta^1_y$ denote respectively rotation components of the x and y coordinate axes of the shot arrangement of wafer W1 from a preassigned x and y coordinate axes of the shot arrangement of wafer W1. $S^1$ represents the displacement of the entire wafer W1 in the xy plane from a preassigned position to a measured position, $S_x$ denotes the displacement of the entire wafer along the x dimension from the preassigned position to the measured position, and $S_y$ denotes the displacement of the entire wafer along the y dimension from the preassigned position to the measured position. These conversion patterns represent a multiplying factor component, a rotation component, and a displacement-from-parallel position component as important factors causing displacement error of the pattern formed on the wafer W1 from the ideal position.

In Step S107, CPU 9 stores in storage device 12 error amount or remainder $E^1$, the difference between the correction position $g^1_i$ obtained by formula (3) with the use of the conversion parameters $B^1$, $\theta^1$, and $S^1$ and the actual position displacement $a^1_i$, the remainder $E^1$ given by formula $E^1=(e^1_1, e^1_2, \ldots, e^1_{24})$.

In Step S108, in accordance with the grids obtained by conversion of the preassigned shot arrangement grids (mark position di) converted by the conversion parameters $B^1$, $\theta^1$, and $S^1$, CPU 9 instructs stage driver 10 to drive the XY stage 11 to perform step-and-repeat operations, whereby each of the shots on wafer W1 are successively exposed.

In Step S109, upon completion of exposure of wafer W1 shots, CPU 9 causes wafer W1 to be stored in a wafer storage carrier (not illustrated) by so instructing a wafer transporting device. Then, CPU 9 causes the process to return to Step S101 and instructs the wafer transporting device to place the wafer W2 to be processed next onto XY stage 11. When the wafer is not the first wafer of the lot, the process proceeds to Step S110.

Figure 2B:
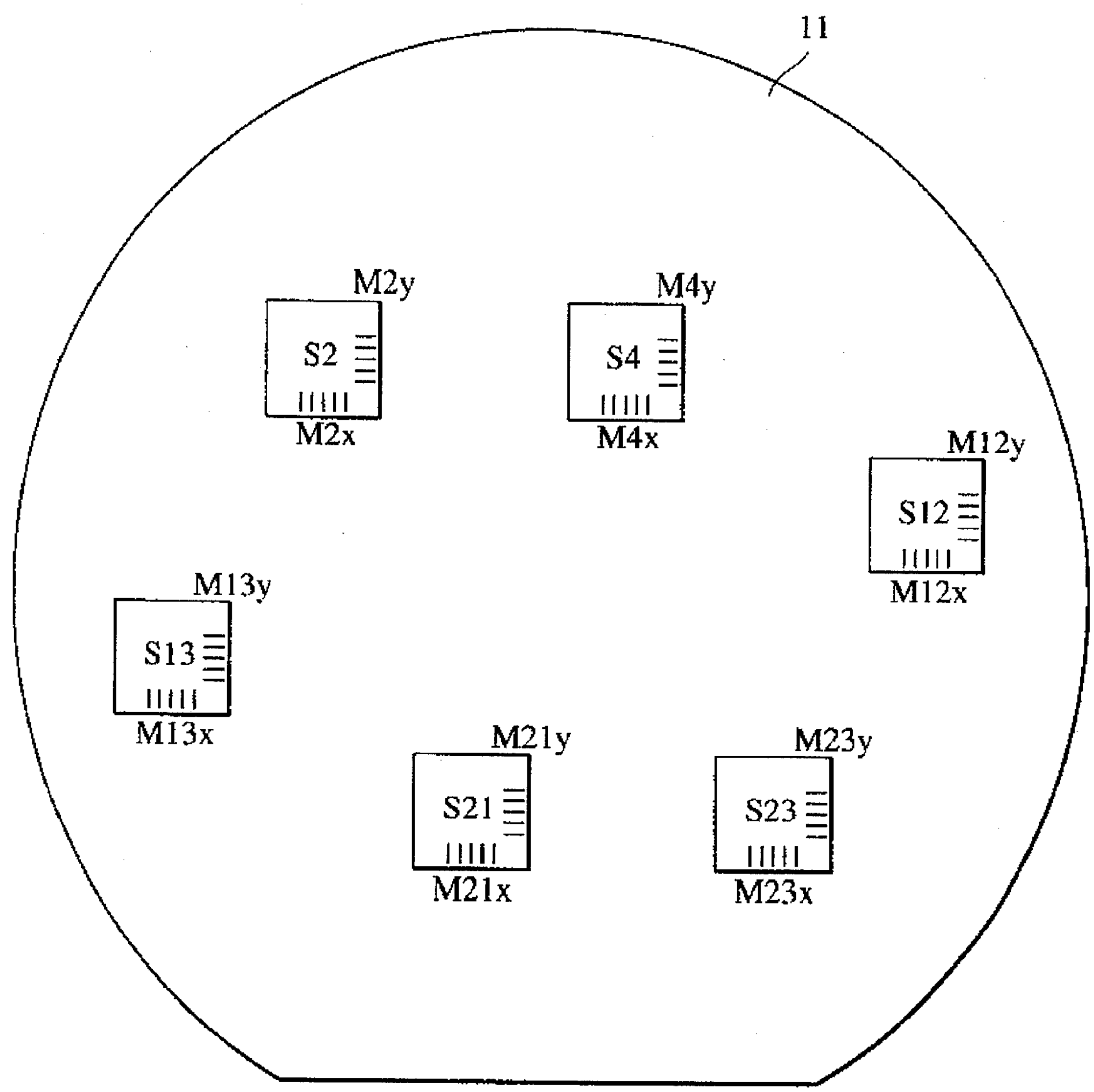

In Step 110, CPU 9 sends a command to stage driver 10 to drive xy stage 11 so that alignment marks M2x and M2y formed at shot area S2 illustrated in FIG. 2*b* are positioned within the field of view of the alignment optical system 2.

In Step S111, CPU 9 measures the position $a^2_2$ of the marks M2x and M2y relative to the reticle R by the same method described in Step S104, which is found by the formula $$a^2_2=[a^2_{x2}, a^2_{y2}]^T$$

In Step 112, as in the first case, with wafer W1 CPU 9 causes Steps S110 and S111 to be repeated, in which alignment marks for shot areas 2, 4, 12, 13, 21, and 23 on wafer W2 are successively measured, until sample measurement is completed. Then, the position $A^2$ of each of the shot areas is measured by formula (6):

$$A^2=\{k \mid a^2_k, \text{ where } k=2, 4, 12, 13, 21, 23\}, \text{ where k identifies the shots that are measured.} \quad (6)$$

In Step 113, based on the position $A^2$ at each of the measurement shot areas obtained from Steps S110 to S112, CPU 9 determines conversion parameters $B^2$, $\theta^2$, and $S^2$ by the same method as that performed in Step 106.

In Step S114, when CPU 9 corrects the grid position based on formula (3) using the obtained conversion parameters $B^2$, $\theta^2$, and $S^2$, the non-linear error amount $E^2$ is obtained from the corrected grid positions at each of the measurement shot positions using formula (7)

$$E^2=\{k \mid e^2_k, \text{ where } k=2, 4, 12, 13, 21, 23\} \quad (7)$$

Then, from this and the non-linear error amount $E^1$, previously stored in storage device 12, formula (8) is used to calculate a weighted coefficient W:

$$W = 1/6 \sum_k \frac{|e_k^2|}{|e_k^1|} \quad (8)$$

where $e^1_k$ is the correction remainder of the kth shot area of wafer W1 and $e^2_k$ is the correction remainder of the kth shot area of wafer W2.

The coefficient W is the ratio of the nonlinear component correction remainder of the shot arrangement on wafer W2 and the nonlinear component of the correction remainder of the shot arrangement on wafer W1.

In Step S115, based on the conversion parameters obtained in Steps S113 and S114, CPU 9 instructs the stage driver 10 to drive the xy stage 11 to perform step-and-repeat operations so that all of the shot areas are subjected to exposure in accordance with the shot arrangement on wafer W2 as the grid marks obtained by correction of the preassigned arrangement grids are corrected by the following formula (9), where i=(1, 2, . . . , 26):

$$g^2_i=B^2\theta^2 d_i+S^2+We^1_i \quad (9)$$

In Step S116, CPU 9 sends a command to the wafer transporting device to allow storage of wafer W2 in a wafer storage place.

In Step S117, the third and subsequent wafers are subjected to measurement by the same process as that performed on W2 until all of the wafers in the same lot have been processed to perform step-and-repeat exposure thereof.

CPU 9 allows previous storage of the number of wafers in a lot. When the lot of the wafers changes, the nonlinear component error of the first wafer is measured and stored as has been done for that of wafer W1, and this process is repeated for the remaining wafers of the same lot as has been done for wafer W2.

Figure 4A:
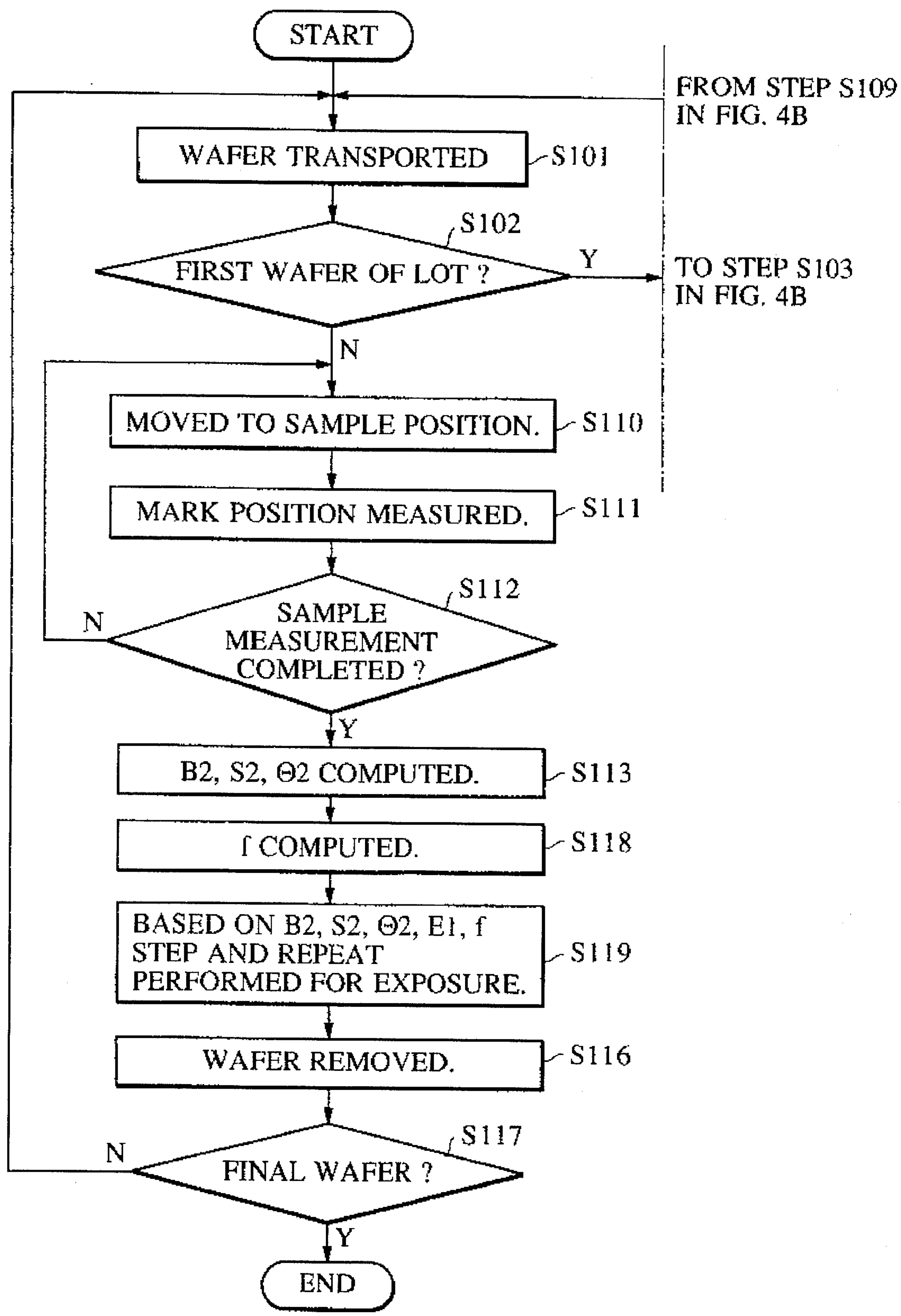
FIGS. 4A and 4B are flowcharts illustrating a second embodiment of an alignment method of the present invention.
Figures 4, 4B:
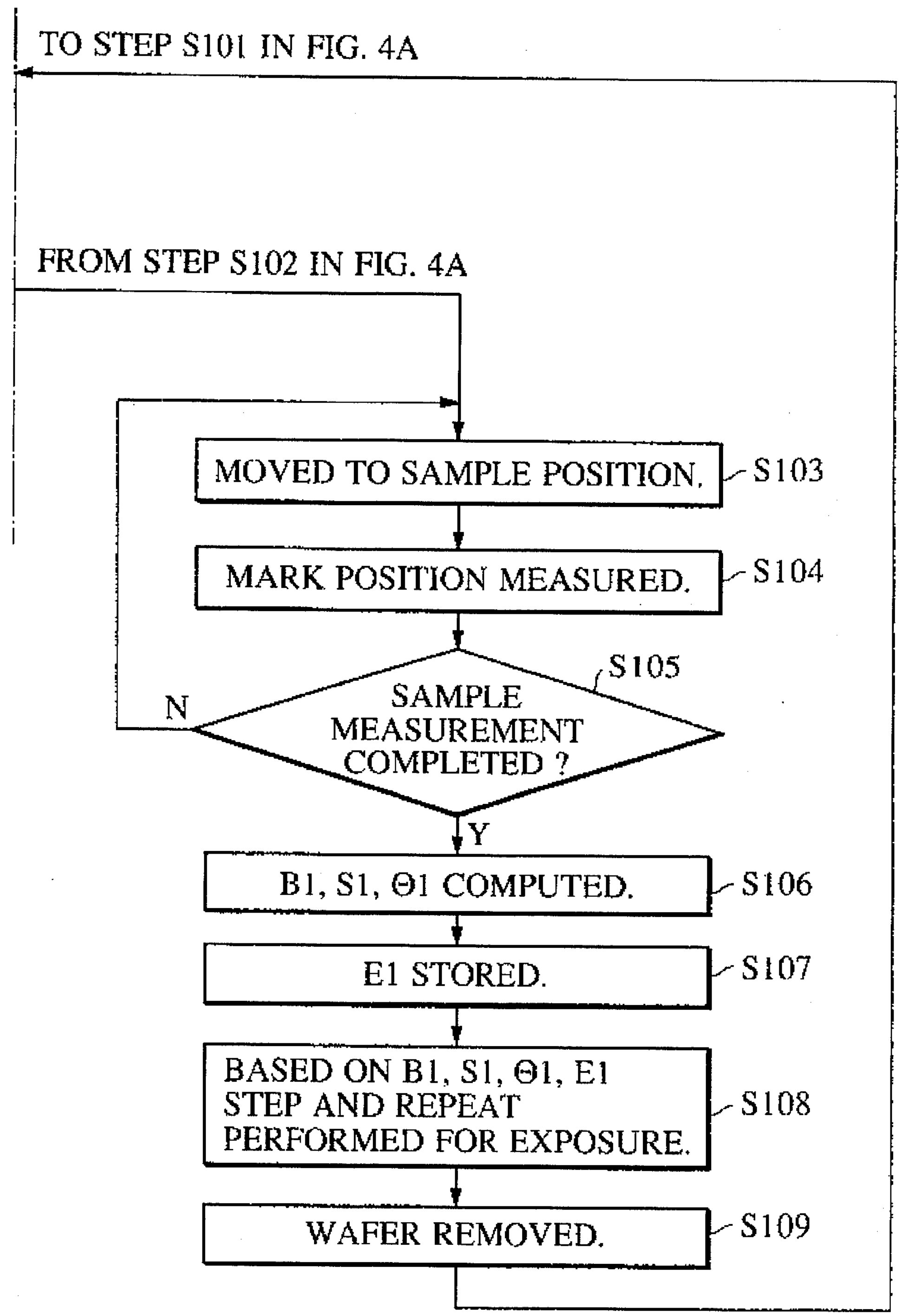
FIG. 4 is a schematic representation of the relationship between FIGS. 4A and 4B.

Although in the first embodiment, coefficient W with respect to the nonlinear component is obtained from the average of each of the nonlinear components, i.e., the correction remainder, and this obtained value is used as a constant value for each of the individual wafers, a coefficient in accordance with each shot position during exposure may also be obtained. With reference to the flowchart of FIG. 4, a description will be hereunder given of such an alignment method of a second embodiment of the application. It is to be noted that Steps S100 to S113 are the same as those of the first embodiment, so that detailed descriptions of these steps will not be repeated.

In Step S118, based on an error amount $E^2$ given by formula (10)

$$E^2=\{k \mid e^2_k, \text{ where } k=2, 4, 12, 13, 21, 23\} \quad (10)$$

and obtained from the corrected grid marks at each measurement shot position as a result of grid mark correction carried out using the conversion parameters $B^2$, $\theta^2$, and $S^2$ obtained in Step S113, and error amount $E^1$ obtained in Step S107, where k=2, 4, 12, 13, 21, 23, a spline function $f^2$ which satisfies the formula (11)

$$f^2(x_k, y_k) = \frac{|e_k^2|}{|e_k^1|} \quad (11)$$

is obtained. This calculated value is stored in an internal memory of the CPU 9 or storage device 12 as a weighted function related to wafer W2. It is to be noted that $(x_k, y_k)$ are coordinate values of the kth preassigned shot.

In Step S119, from the conversion parameters and weighted function $f^2$ obtained respectively in Steps 113 and 118, CPU 9 defines the wafer W2 shot arrangement as a correction grid position $g^2_i$ of the ith shot of the wafer W2 in which the preassigned arrangement grid point position has been corrected by the following formula (12), where i=(1, 2, . . . , 24). According to this position, all of the shot areas are exposed while XY 11 stage performs step-and-repeat operations.

$$g_2^i=B^2\theta^2 d_i+S^2+f^2(x_i, y_i)e^1_i \quad (12)$$

In this case, since each of the shot grid points is weighted based on weighted function $f^2$ representing the distribution of the ratio of the amount of error obtained for wafer W2 and that obtained for wafer W1, changes in the nonlinear component of wafer W2 with respect to wafer W1 are also taken into consideration, so that high precision alignment can be performed.

Subsequently, Step S116 and onwards are repeated as has been performed in the first embodiment until all of the wafers of the same lot have been measured and subjected to step-and-repeat exposure.

What is claimed is:

1. An alignment method for successively aligning a plurality of alignment areas of a plurality of successively supplied substrates with predetermined reference positions, the plurality of alignment areas of each substrate being formed in accordance with a predetermined arrangement, the plurality of successively supplied substrates comprising at least first and second substrates, said method comprising the steps of:

performing a first process of measuring the positions of the alignment areas of the first substrate with respect to preassigned positions of the alignment areas comprising a preassigned arrangement of the alignment areas to obtain an actual arrangement for the alignment areas of the first substrate;

performing a second process of determining conversion parameters of a conversion formula for the first substrate representing the relationship between the actual arrangement of alignment areas and the preassigned arrangement of alignment areas obtained in said first process for the first substrate, the conversion formula also including a correction remainder for the first substrate representing the error in the actual arrangement as compared to the preassigned arrangement for the first substrate, said second process also comprising the step of determining the correction remainder for the first substrate;

a third process of storing non-linear error data for the first substrate representing the amount of the error in the measured position of each of the alignment areas measured in said first process performing step with respect to the preassigned positions of the alignment areas for the first substrate based on the correction remainder;

a fourth process of aligning the first substrate based on the conversion formula comprising the conversion parameters and the correction remainder determined in said second process; and a fifth processing of repeating said first, second and third processes for the second substrate to obtain a conversion formula for the second substrate, conversion parameters for the second substrate, a correction remainder for the second substrate, and non-linear error data for the second substrate and for aligning the second substrate based on the non-linear error data for the first and second substrates.

2. An alignment method according to claim 1, wherein said fifth process comprises the steps of determining a weighted function based on the non-linear error data for the first and second substrates and performing weighting of the error data used to align the second substrate using the weighted function.

3. An alignment method according to claim 2, further comprising the step of determining the weighted function by the distance between the position of an alignment area and a grid point used when the conversion parameters are being obtained for the first substrate.

4. An alignment method according to claim 2, further comprising the step of determining the weighted function by computing the ratio of the non-linear error data for the first substrate and the non-linear error data obtained for the second substrate.

* * * * *

UNITED STATES PATENT AND TRADEMARK OFFICE

CERTIFICATE OF CORRECTION

PATENT NO. : 5,585,925

DATED : December 17, 1996

INVENTOR(S) : MAKOTO SATO, ET AL.

It is certified that error appears in the above-indentified patent and that said Letters Patent is hereby corrected as shown below:

COLUMN 8:

Line 56, "$g_2{}^i$" should read --$g^2{}_i$--.

Signed and Sealed this

Twelfth Day of August, 1997

Attest:

BRUCE LEHMAN

Attesting Officer

*Commissioner of Patents and Trademarks*